United States Patent
Liu et al.

(10) Patent No.: US 10,418,440 B2
(45) Date of Patent: Sep. 17, 2019

(54) MEMORY STRUCTURE

(71) Applicant: Winbond Electronics Corp., Taichung (TW)

(72) Inventors: Chung-Hsien Liu, Taichung (TW); Chun-Hsu Chen, Taichung (TW); Lu-Ping Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/690,298

(22) Filed: Aug. 30, 2017

(65) Prior Publication Data
US 2018/0308929 A1    Oct. 25, 2018

(30) Foreign Application Priority Data
Apr. 19, 2017    (CN) .......................... 2017 1 0256627

(51) Int. Cl.
*H01L 21/02* (2006.01)
*H01L 21/336* (2006.01)
(Continued)

(52) U.S. Cl.
CPC .... *H01L 29/0653* (2013.01); *H01L 21/28273* (2013.01); *H01L 21/76224* (2013.01);
(Continued)

(58) Field of Classification Search
CPC ......... H01L 21/02164; H01L 21/02282; H01L 21/31612; H01L 21/76224; H01L 27/115;
(Continued)

(56) References Cited

U.S. PATENT DOCUMENTS 7,659,159 B2 * 2/2010 Lee ...................... H01L 27/115
                                                              257/374
8,501,607 B1 * 8/2013 Juengling ......... H01L 29/66795
                                                              438/587
(Continued)

FOREIGN PATENT DOCUMENTS

JP    2005332885    12/2005
JP    2008141157    6/2008
(Continued)

OTHER PUBLICATIONS

"Office Action of Japan Counterpart Application", dated Jan. 22, 2019, p. 1-p. 5.

*Primary Examiner* — Mary A Wilczewski
*Assistant Examiner* — Tsz K Chiu
(74) *Attorney, Agent, or Firm* — JCIPRNET

(57) ABSTRACT

A memory structure including a substrate, stacked structures, at least one isolation structure, a second conductive layer, and a second dielectric layer is provided. The stacked structures are disposed on the substrate. Each of the stacked structures includes a first dielectric layer and a first conductive layer sequentially disposed on the substrate. A first opening is located between two adjacent stacked structures, and the first opening extends into the substrate. The isolation structure is disposed in the first opening and covers a sidewall of the first dielectric layer. The isolation structure has a recess, such that a top profile of the isolation structure is shaped as a funnel. The second conductive layer is disposed on the stacked structures and fills the first opening. The second dielectric layer is disposed between the second conductive layer and the first conductive layer.

10 Claims, 9 Drawing Sheets

(51) Int. Cl.
*H01L 29/06* (2006.01)
*H01L 27/11517* (2017.01)
*H01L 21/762* (2006.01)
*H01L 21/28* (2006.01)
*H01L 27/11521* (2017.01)
*H01L 29/66* (2006.01)
*H01L 27/115* (2017.01)
*H01L 29/788* (2006.01)

(52) U.S. Cl.
CPC .. *H01L 27/11517* (2013.01); *H01L 27/11521* (2013.01); *H01L 27/115* (2013.01); *H01L 29/6684* (2013.01); *H01L 29/66825* (2013.01); *H01L 29/7881* (2013.01)

(58) Field of Classification Search
CPC ........... H01L 29/66825; H01L 29/7881; H01L 27/10844; H01L 29/42356
See application file for complete search history.

(56) References Cited

U.S. PATENT DOCUMENTS

| | | | |
|---|---|---|---|
| 9,455,176 B2* | 9/2016 | Tsao | H01L 29/0653 |
| 2005/0258463 A1* | 11/2005 | Yaegashi | H01L 27/115 257/296 |
| 2010/0087043 A1* | 4/2010 | Cheng | H01L 21/76229 438/424 |
| 2011/0049669 A1* | 3/2011 | Lee | H01L 21/76232 257/510 |
| 2014/0203376 A1* | 7/2014 | Xie | H01L 21/76224 257/401 |
| 2014/0227858 A1* | 8/2014 | Shen | H01L 21/76224 438/430 |
| 2014/0353795 A1* | 12/2014 | Tong | H01L 21/76224 257/506 |

FOREIGN PATENT DOCUMENTS

| | | |
|---|---|---|
| JP | 2010225916 | 10/2010 |
| TW | 200820372 | 5/2008 |

* cited by examiner

MEMORY STRUCTURE

CROSS-REFERENCE TO RELATED APPLICATION

This application claims the priority benefit of China application serial no. 201710256627.7, filed on Apr. 19, 2017. The entirety of the above-mentioned patent application is hereby incorporated by reference herein and made a part of this specification.

BACKGROUND OF THE INVENTION

Field of the Invention

The invention relates to a semiconductor structure and a manufacturing method thereof; particularly, the invention relates to a memory having a shallow trench isolation (STI) structure and a manufacturing method of the memory.

Description of Related Art

As the level of integration of semiconductor devices increases, sizes of the semiconductor devices continuously decrease, thus leading to increasing mutual influence on the semiconductor devices. Generally, isolation structures are applied to isolate the semiconductor devices from one another, so as to avoid significant influences and improve the reliability of the devices. In memory devices, the excessively small heights of the isolation structures may easily cause the mutual interference during programming actions and cause potential damages to tunneling dielectric layers, such that the reliability of the memory devices is deteriorated. If the heights of the isolation structures are excessively large, however, the gate coupling ratio (GCR) may decrease, and thus the performance of the memory devices is lowered.

SUMMARY OF THE INVENTION

The invention provides a memory structure and a manufacturing method thereof, whereby the performance and reliability of memory devices may be effectively improved.

The invention provides a memory structure including a substrate, stacked structures, at least one isolation structure, a second conductive layer, and a second dielectric layer. The stacked structures are disposed on the substrate. Each of the stacked structures includes a first dielectric layer and a first conductive layer sequentially disposed on the substrate. A first opening is located between two adjacent stacked structures, and the first opening extends into the substrate. The isolation structure is disposed in the first opening and covers a sidewall of the first dielectric layer. The isolation structure has a recess therein, such that a top profile of the isolation structure is shaped as a funnel. The isolation structure includes a first isolation layer, a second isolation layer and a lining layer. The first isolation layer is disposed in the first opening and having a second opening therein, wherein a top of the first isolation layer located on a sidewall of the first opening is higher than a top of the first dielectric layer. The second isolation layer is disposed in the second opening, wherein a top of the second isolation layer is lower than the top of the first isolation layer. The lining layer is located between the first isolation layer and the substrate, and between the first isolation layer and the stacked structures. The second conductive layer is disposed on the stacked structures and fills the first opening. The second dielectric layer is disposed between the second conductive layer and the first conductive layer.

The invention provides a method of manufacturing a memory structure. The method of manufacturing the memory structure includes steps as follows. Stacked structures are formed on a substrate, and each of the stacked structures includes a first dielectric layer and a first conductive layer sequentially disposed on the substrate. A first opening is located between two adjacent stacked structure, and the first opening extends into the substrate. At least one isolation structure is formed in the first opening. The isolation structure covers a sidewall of the first dielectric layer. The isolation structure has a recess therein, such that a top profile of the isolation structure is shaped as a funnel. A method of forming the isolation structure includes steps as follows. A first isolation material layer filling the first opening is formed. The first isolation material layer has a second opening therein. A second isolation material layer is formed on the first isolation material layer, and the second isolation material layer fills up the second opening. A portion of the first isolation material layer and a portion of the second isolation material layer are removed to form a first isolation layer and a second isolation layer. A top of the second isolation layer is lower than a top of the first isolation layer. A second dielectric layer is formed on the stacked structures. A second conductive layer is formed on the second dielectric layer and fills the first opening.

The invention provides a memory structure including a substrate, stacked structures, at least one isolation structure, a dielectric layer and a conductive layer is provided. The stacked structures are disposed on the substrate. A first opening is located between two adjacent stacked structures of the stacked structures. The isolation structure fills the first opening and includes a first isolation layer and a second isolation layer disposed on the first isolation layer. The dielectric layer covers tops and sidewalls of the stacked structures, a top of the first isolation layer and a top of the second isolation layer. The dielectric layer has a recess at the second isolation layer with respect to the first isolation layer. The conductive layer covers the dielectric layer.

Based on the above, in the memory structure and the manufacturing method thereof, the isolation structure has a recess therein, such that the top profile of the isolation structure is shaped as a funnel. Since the memory structure has the isolation structure with the funnel-shaped top profile, the isolation structure on the sidewall of the first opening remains at a certain height and covers the sidewall of the first dielectric layer, such that the isolation structure may protect the sidewall of the first dielectric layer and avoid mutual interference during programming actions. The reliability of the memory devices is thereby improved. Moreover, since the isolation structure with the funnel-shaped top profile has a recess therein, a GCR may be increased, and the performance of the memory devices is thereby improved.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
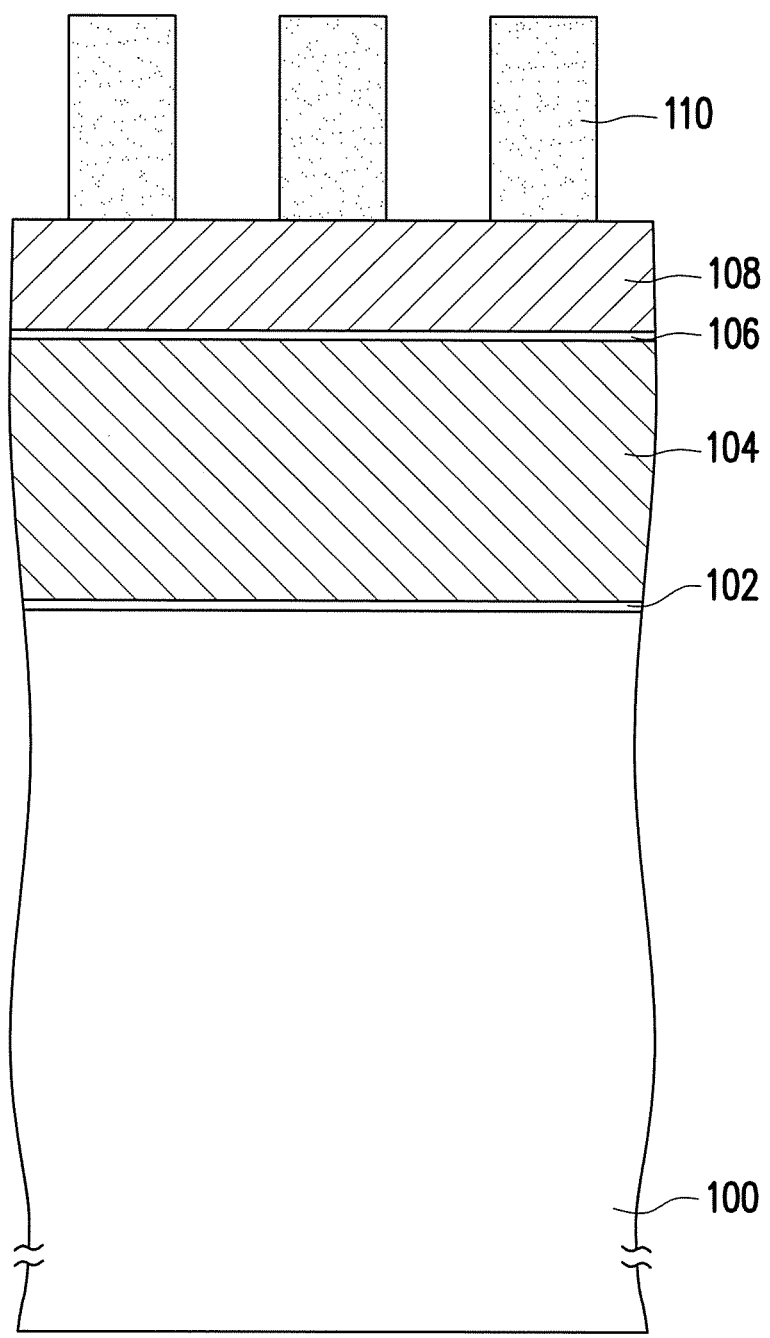
FIG. 1A to FIG. 1I are schematic cross-sectional views of a manufacturing process of a memory structure according to an embodiment of the invention.

Referring to FIG. 1A, a first dielectric material layer 102, a first conductive material layer 104, a buffer material layer 106, and a mask material layer 108 are sequentially formed on a substrate 100. The substrate 100 may be a semiconductor substrate, such as a silicon substrate. A material of the first dielectric material layer 102 is, for example, silicon oxide, and the first dielectric material layer 102 is formed by thermal oxidation, for instance. A material of the first conductive material layer 104 is, for example, doped polysilicon, and the first conductive material layer 104 is formed by chemical vapor deposition (CVD), for instance. A material of the buffer material layer 106 is, for example, silicon oxide, and the buffer material layer 106 is formed by CVD, for instance. A material of the mask material layer 108 is, for example, silicon nitride, and the mask material layer 108 is formed by CVD, for instance.

A patterned photoresist layer 110 is then formed on the mask material layer 108. The patterned photoresist layer 110 may be formed by photolithography.

Figure 1B:
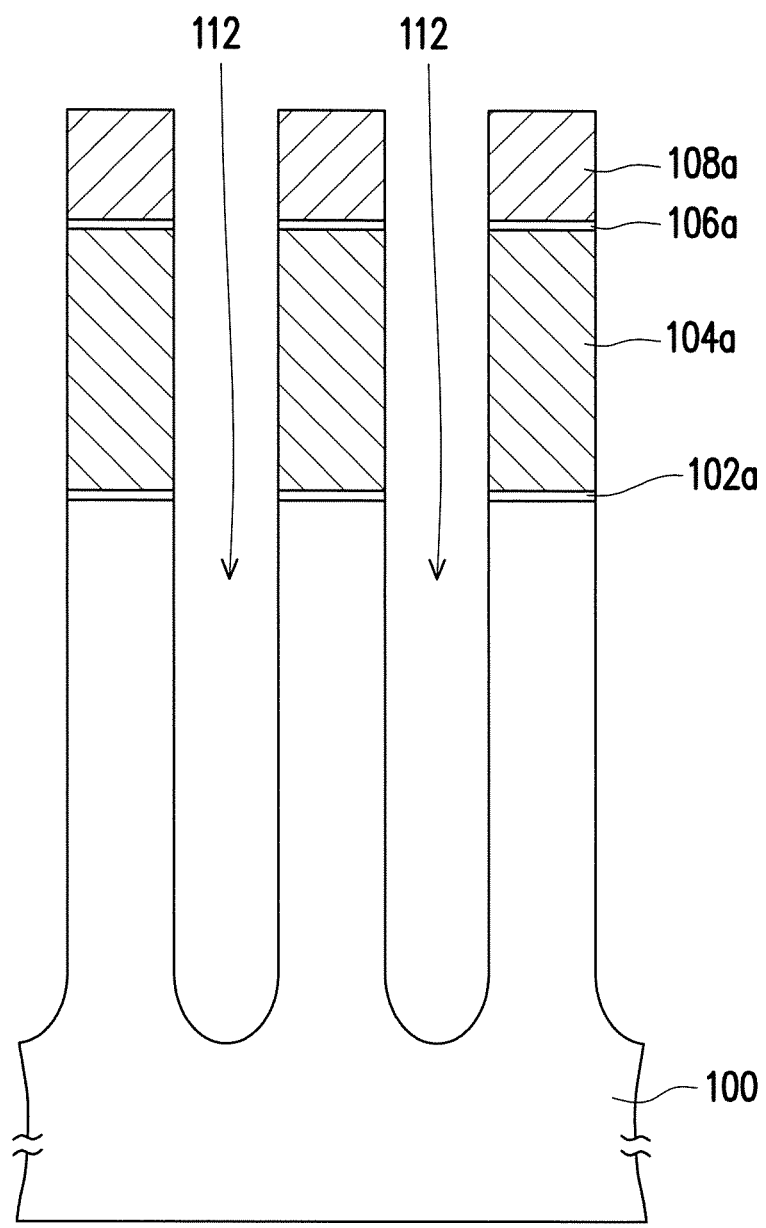

Referring to FIG. 1B, a portion of the mask material layer 108, a portion of the buffer material layer 106, a portion of the first conductive material layer 104, a portion of the first dielectric layer 102, and a portion of the substrate 100 are removed by using the patterned photoresist layer 110 as a mask, such that a first opening 112 is formed. Therefore, a first dielectric layer 102a, a first conductive layer 104a, a buffer layer 106a, and a mask layer 108a are sequentially formed on the substrate 100. The first dielectric layer 102a may serve as a tunneling dielectric layer, and the first conductive layer 104a may serve as a floating electrode.

Following the above, the patterned photoresist layer 110 is removed. A method of removing the patterned photoresist layer 110 is, for example, dry stripping or wet stripping.

Figure 1C:
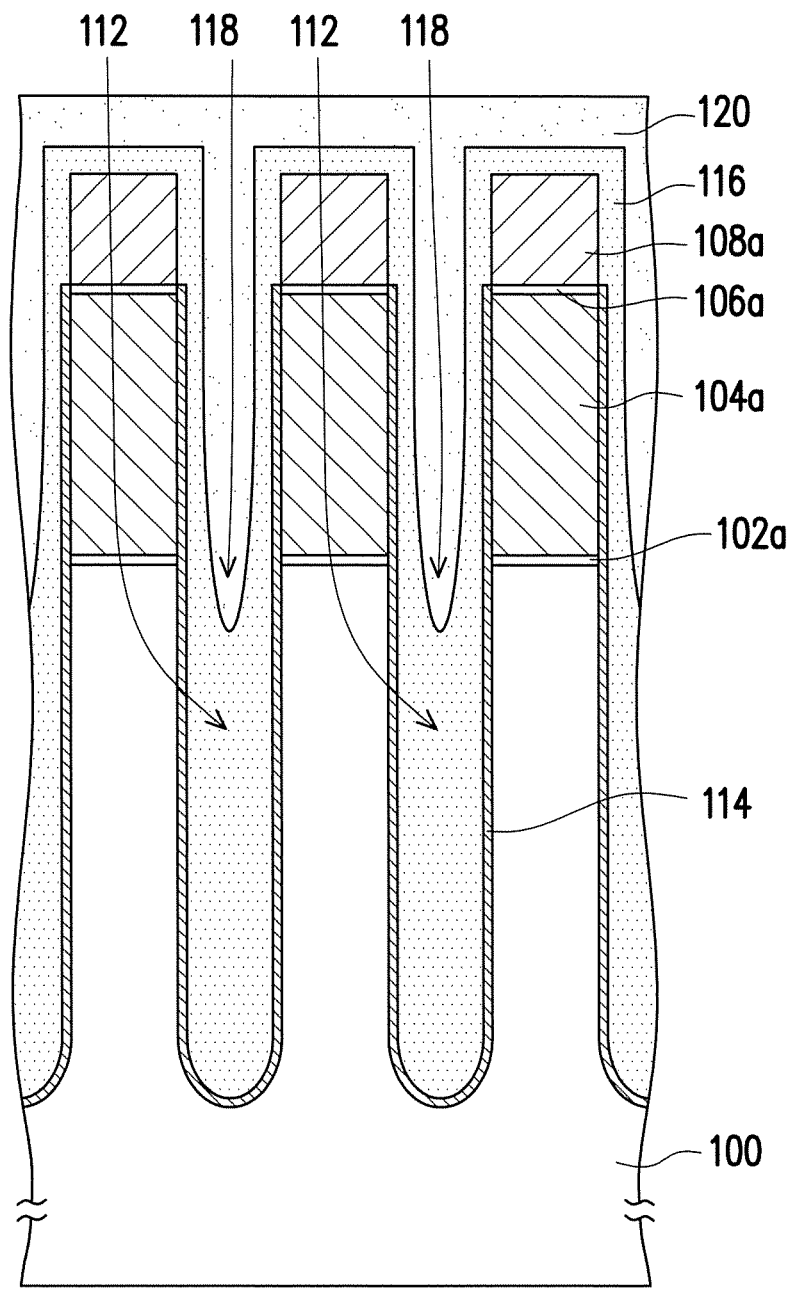

Referring to FIG. 1C, a lining material layer 114 may be formed on a surface of the first opening 112. For instance, the lining material layer 114 may be formed on a surface of the substrate 100 in the first opening 112, a sidewall of the first dielectric layer 102a, a sidewall of the first conductive layer 104a, and a sidewall of the buffer layer 106a. A material of the lining material layer 114 is, for example, oxide, such as silicon oxide. A method of forming the lining material layer 114 is, for example, in-situ steam generation (ISSG) or plasma oxidation.

A first isolation material layer 116 filling the first opening 112 is formed. The first isolation material layer 116 may be located on the lining material layer 114. The first isolation material layer 116 has a second opening 118 therein. A material of the first isolation material layer 116 is, for example, oxide, such as silicon oxide. A method of forming the first isolation material layer 116 is, for example, an enhanced-high-aspect-ratio process (eHARP).

A second isolation material layer 120 is formed on the first isolation material layer 116, and the second isolation material layer 120 fills up the second opening 118. A material of the second isolation material layer 120 is, for example, oxide, such as spin-on glass (SOG). A method of forming the second isolation material layer 120 is, for example, a spin-coating method.

Figure 1D:
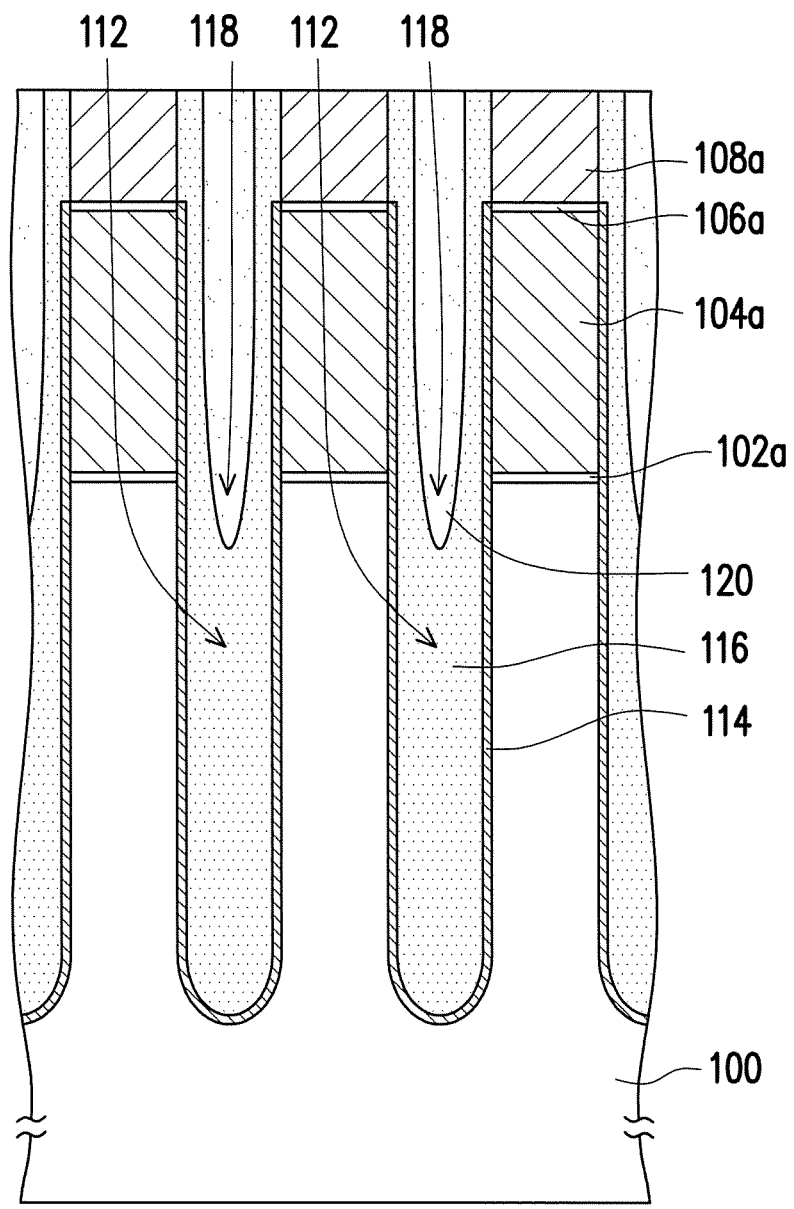

Referring to FIG. 1D, the second isolation material layer 120 and the first isolation material layer 116 outside the first opening 112 are removed. A method of such removal is, for example, chemical-mechanical polishing (CMP).

Figure 1E:
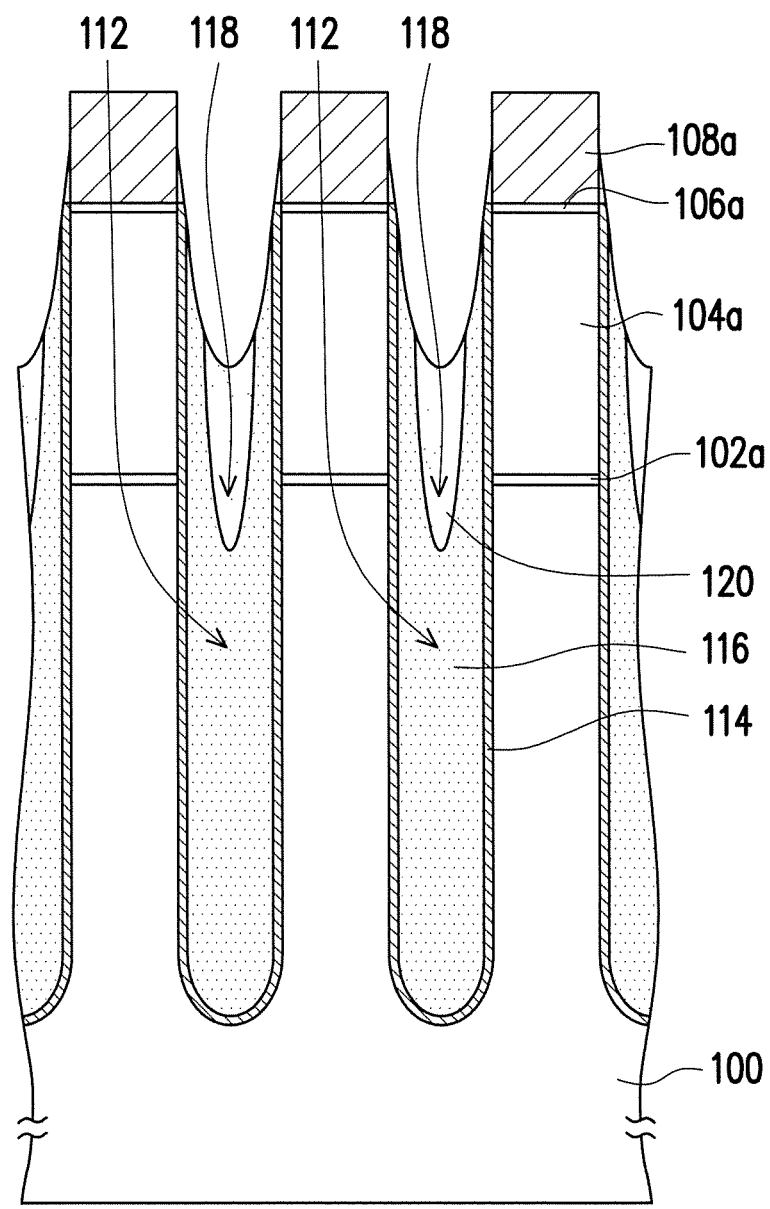

Referring to FIG. 1E, a first dry-etching process is performed to remove a portion of the first isolation material layer 116 and a portion of the second isolation material layer 120 in the first opening 112. Heights of the first isolation material layer 116 and the second isolation material layer 120 are then lowered. The first dry-etching process is, for example, a reactive-ion etching (RIE) process. Moreover, a portion of the lining material layer 114 may be removed simultaneously during the first dry-etching process.

Figure 1F:
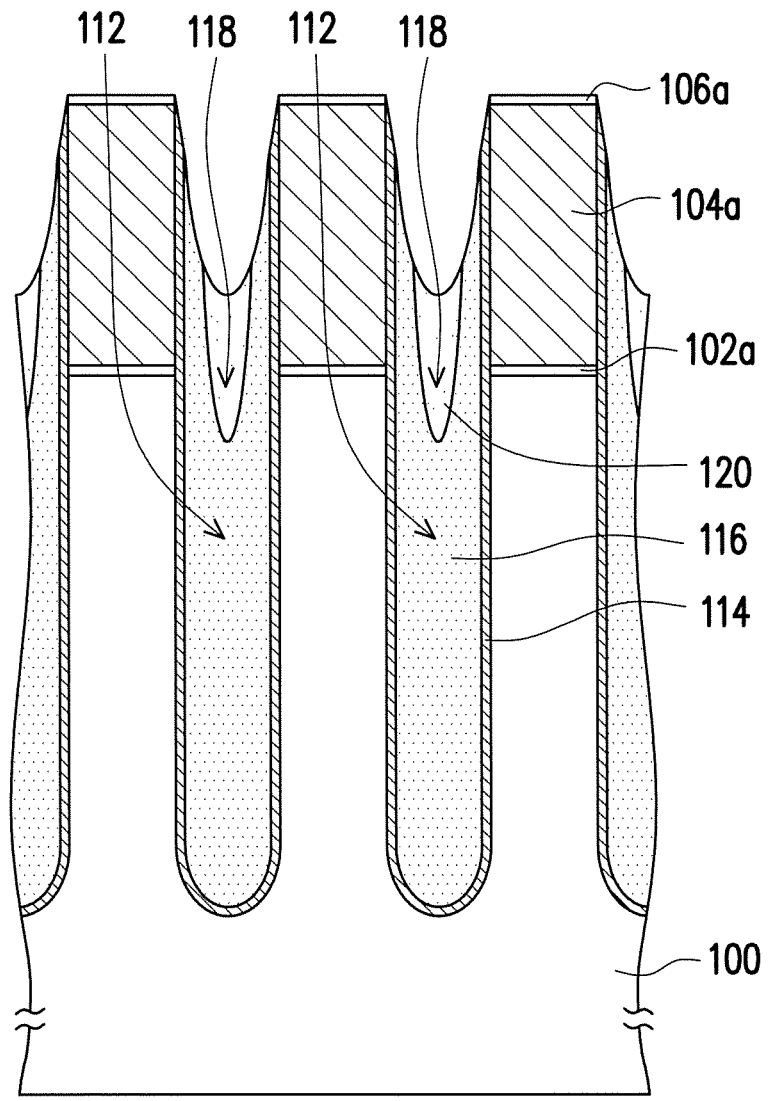

Referring to FIG. 1F, a first wet-etching process is performed to remove the mask layer 108a. An etchant used in the first wet-etching process is, for example, hot phosphoric acid.

Figure 1G:
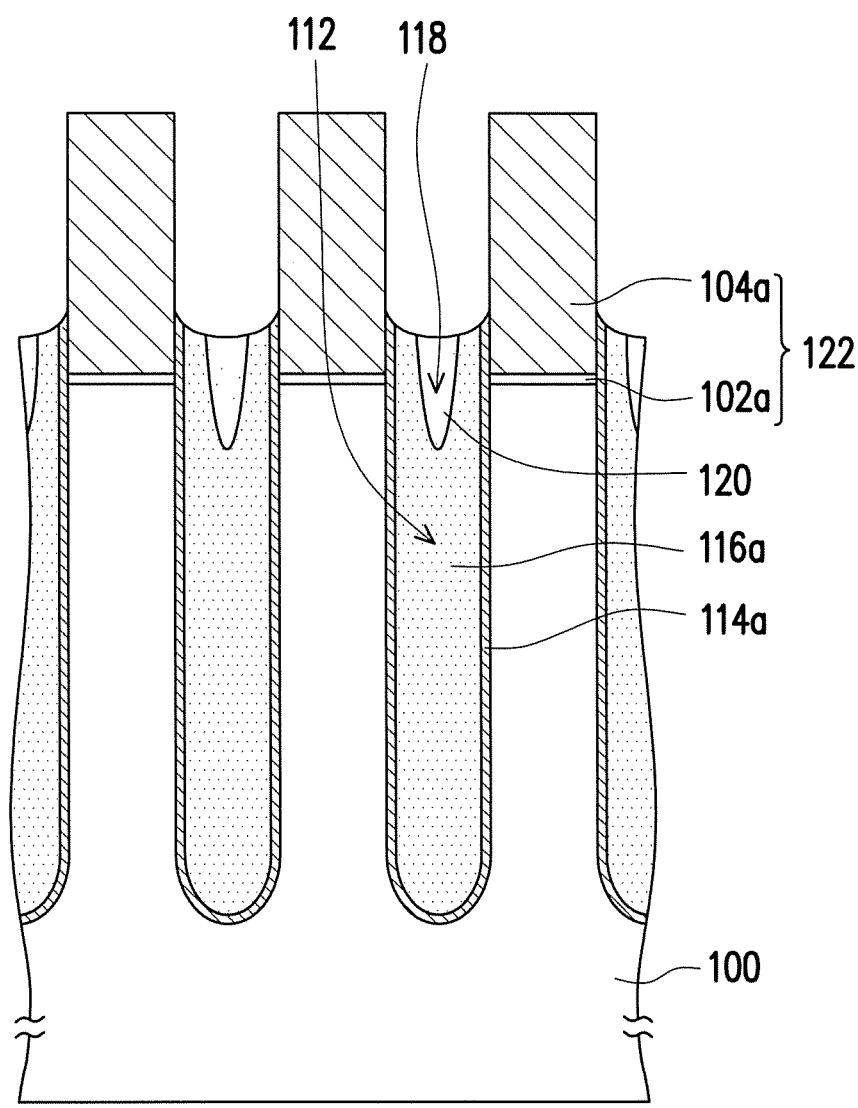

Referring to FIG. 1G, a second dry-etching process is performed to remove a portion of the first isolation material layer 116 located on the sidewall of the first conductive layer 104a, such that a first isolation layer 116a is formed. The second dry-etching process is, for example, a SiCoNi etching process. Moreover, a portion of the lining material layer 114 may be removed simultaneously during the second dry-etching process, such that a lining layer 114a is formed. A portion of the second isolation material layer 120 and the buffer layer 106a may also be removed simultaneously during the second dry-etching process, and stacked structures 122 are formed on the substrate 100. The stacked structures 122 include the first dielectric layer 102a and the first conductive layer 104a that are sequentially disposed on the substrate 100.

Figure 1H:
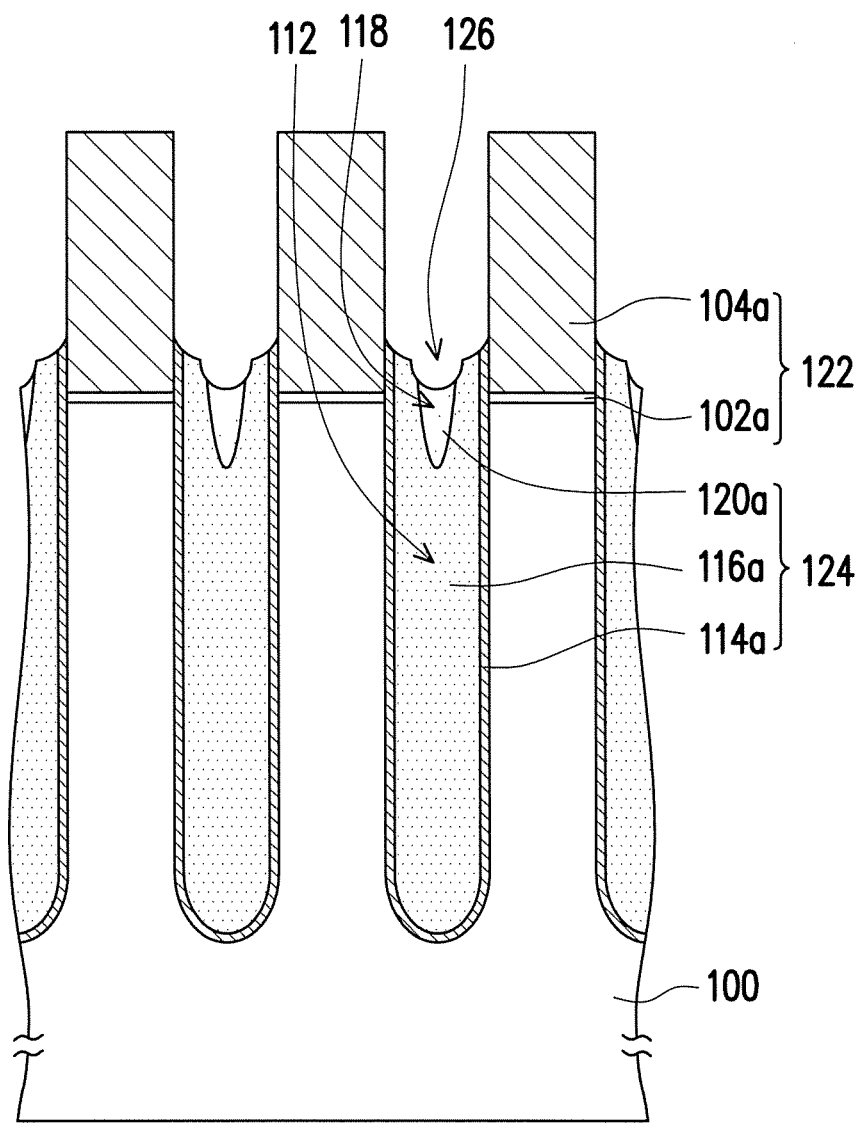

Referring to FIG. 1H, a second wet-etching process is performed to remove a portion of the second isolation material layer 120 located in the second opening 118, such that a second isolation layer 120a is formed. A top of the second isolation layer 120a is lower than a top of the first isolation layer 116a. Moreover, a portion of the first isolation layer 116a and a portion of the lining layer 114a may be removed simultaneously during the second wet-etching process. An etchant used in the second wet-etching process is, for example, diluted hydrofluoric acid. A speed of removing the second isolation material layer 120 through the second wet-etching process is, for example, greater than a speed of removing the first isolation layer 116a through the second wet-etching process.

Besides, at least one isolation structure 124 may be formed in the first opening 112 by the first isolation layer 116a and the second isolation layer 120a. In this embodiment of the invention, plural isolation structures 124 are exemplarily formed, whereas the invention is not limited to the above. The isolation structures 124 cover a sidewall of the first dielectric layer 102a. A material of the first isolation layer 116a is, for example, eHARP oxide. The isolation structures 124 may further include the lining layer 114a. The lining layer 114a is located between the first isolation layer 116a and the substrate 100 and between the first isolation layer 116a and the stacked structures 122. A material of the lining layer 114a is, for example, ISSG oxide.

Additionally, since the top of the second isolation layer 120a is lower than the top of the first isolation layer 116a, the isolation structures 124 have a recess 126 therein, and a top profile of the isolation structures 124 is shaped as a funnel. The recess 126 may be located at the second isolation layer 120a. A top of the isolation structures 124 is, for example, lower than a top of the stacked structures 122. A shape of the recess 126 is, for example, an arc shape. A width of the recess 126 is, for example, in a range from 25% to 50% of a distance of two adjacent stacked structures 122.

Figure 1I:
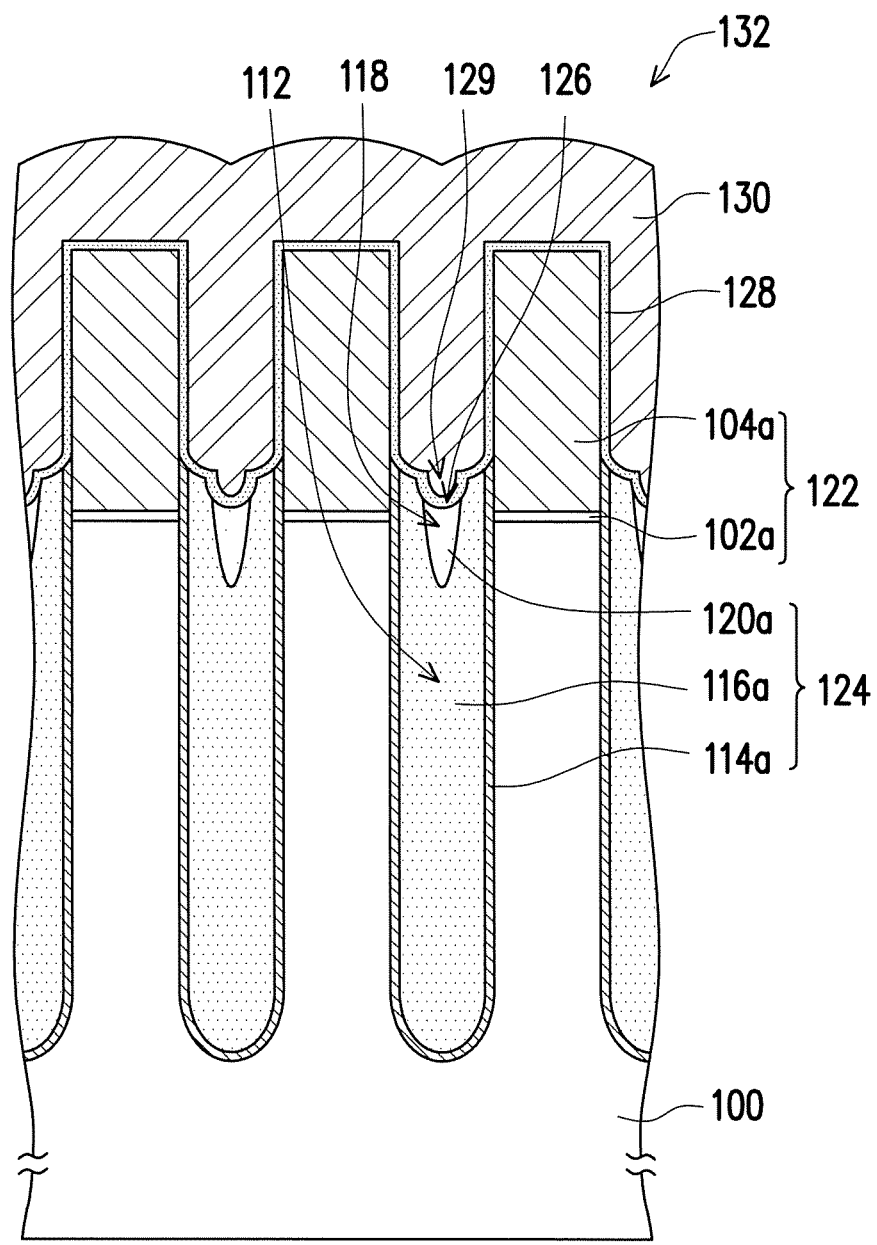

Referring to FIG. 1I, a second dielectric layer 128 is formed on the stacked structures 122. The second dielectric layer 128 covers tops and sidewalls of the stacked structures 122, a top of the first isolation layer 116a and a top of the second isolation layer 120a. The second dielectric layer 128 has the recess 129 at the second isolation layer 120a with respect to the first isolation layer 116a. A shape of the recess 129 is, for example, an arc shape. The second dielectric layer 128 may act as an inter-gate dielectric layer. The second dielectric layer 128 may have a multi-layer structure or a single-layer structure. The multi-layer structure is, for example, a composite layer having a silicon oxide layer/a silicon nitride layer/a silicon oxide layer. The single-layer structure is, for example, a silicon oxide layer.

Afterwards, a second conductive layer 130 is formed on and covering the second dielectric layer 128. The second conductive layer 130 fills the first opening 112. In this embodiment of the invention, the second conductive layer 130 exemplarily fills up the first opening 112. The second conductive layer 130 may serve as a control gate. A material of the second conductive layer 130 is, for example, doped polysilicon and may be formed by CVD.

According to the embodiment above, in the manufacturing method of a memory structure 132, the isolation structures 124 have a recess 126 therein, and the top profile of the isolation structures 124 is thereby shaped as a funnel. Since the memory structure 132 has the isolation structures 124 with the funnel-shaped top profile, the isolation structures 124 on the sidewalls of the first opening 112 remain at a certain height and cover the sidewall of the first dielectric layer 102a, such that the isolation structures 124 may protect the sidewall of the first dielectric layer 102a and avoid mutual interference during programming actions. The reliability of the memory devices is thereby improved. Moreover, since the isolation structures 124 with the funnel-shaped top profile have the recess 126 therein, a GCR may be effectively increased, and the performance of the memory devices is thereby improved.

FIG. 1I serves to explain the memory structure 132 mentioned in the embodiment above.

Referring to FIG. 1I, the memory structure 132 includes the substrate 100, the stacked structures 122, the at least one isolation structure 124, the second conductive layer 130, and the second dielectric layer 128. The stacked structures 122 are disposed on the substrate 100. Each of the stacked structures 122 includes the first dielectric layer 102a and the first conductive layer 104a sequentially disposed on the substrate 100. The first opening 112 is located between two adjacent stacked structures 122 and extends into the substrate 100. The isolation structure 124 is disposed in the first opening 122 and covers the sidewall of the first dielectric layer 102a. The isolation structure 124 has the recess 126 therein, such that the top profile of the isolation structure 124 is shaped as a funnel. The isolation structure 124 includes the first isolation layer 116a and the second isolation layer 120a. The first isolation layer 116a is disposed in the first opening 112, and the first isolation layer 116a has the second opening 118 therein. The top of the first isolation layer 116a on the sidewall of the first opening 112 is higher than the top of the first dielectric layer 102a. The second isolation layer 120a is disposed in the second opening 118. The top of the second isolation layer 120a is lower than the top of the first isolation layer 116a. The isolation structure 124 further includes the lining layer 114a. The lining layer 114a is disposed between the first isolation layer 116a and the substrate 100 and between the first isolation layer 116a and the stacked structures 122. The second conductive layer 130 is disposed on the stacked structures 122 and fills the first opening 112. The second dielectric layer 128 is disposed between the second conductive layer 130 and the first conductive layer 104a. Moreover, the second dielectric layer 128 may also be disposed between the second conductive layer 130 and the isolation structure 124.

To sum up, in the above-mentioned memory structure and the manufacturing method thereof, the isolation structure has a recess therein, such that the top profile of the isolation structure 124 is shaped as a funnel. As a result, mutual interference occurring during programming actions may be avoided, the GCR is increased, and the reliability and performance of the memory devices are improved.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A memory structure comprising:
   a substrate;
   stacked structures disposed on the substrate, wherein each of the stacked structures comprises a first dielectric layer and a first conductive layer sequentially disposed on the substrate, a first opening is located between two adjacent stacked structures of the stacked structures, and the first opening extends into the substrate;
   at least one isolation structure disposed in the first opening and covering a sidewall of the first dielectric layer, wherein the at least one isolation structure has a recess therein, such that a top profile of the at least one isolation structure is shaped as a funnel, wherein the at least one isolation structure comprises:
      a first isolation layer disposed in the first opening and having a second opening therein, wherein a top of the first isolation layer located on a sidewall of the first opening is higher than a top of the first dielectric layer; and
      a second isolation layer disposed in the second opening, wherein a top of the second isolation layer is lower than the top of the first isolation layer, and a top surface of the second isolation layer is a concave surface; and
      a lining layer located between the first isolation layer and the substrate, and between the first isolation layer and the stacked structures;
   a second conductive layer disposed on the stacked structures and filling the first opening; and
   a second dielectric layer disposed between the second conductive layer and the first conductive layer.

2. The memory structure of claim 1, wherein a top of the at least one isolation structure is lower than a top of the stacked structures.

3. The memory structure of claim 1, wherein a shape of the recess comprises an arc shape.

4. The memory structure of claim 1, wherein a width of the recess is in a range from 25% to 50% of a distance of the two adjacent stacked structures.

5. The memory structure of claim 1, wherein the recess is located at the second isolation layer.

6. The memory structure of claim 1, wherein a material of the lining layer comprises an in-situ-steam-generation (ISSG) oxide, a material of the first isolation layer comprises an enhanced-high-aspect-ratio process (eHARP) oxide, and a material of the second isolation layer comprises spin-on glass (SOG).

7. A memory structure comprising:
a substrate;
stacked structures disposed on the substrate, wherein a first opening is located between two adjacent stacked structures of the stacked structures;
at least one isolation structure filling the first opening and including a first isolation layer and a second isolation layer disposed on the first isolation layer, wherein a top surface of the second isolation layer is a concave surface;
a dielectric layer covering tops and sidewalls of the stacked structures, a top of the first isolation layer and a top of the second isolation layer, wherein the dielectric layer has a recess at the second isolation layer with respect to the first isolation layer; and
a conductive layer covering the dielectric layer, wherein the at least one isolation structure further comprises a lining layer located between the first isolation layer and the substrate, and between the first isolation layer and the stacked structures.

8. The memory structure of claim 7, wherein
the first isolation layer is disposed in the first opening and has a second opening therein, and
the second isolation layer is disposed in the second opening, wherein the top of the second isolation layer is lower than the top of the first isolation layer.

9. The memory structure of claim 7, wherein a top of the at least one isolation structure is lower than a top of the stacked structures.

10. The memory structure of claim 7, wherein a shape of the recess comprises an arc shape.

* * * * *